United States Patent [19]

Tsuda et al.

[11] Patent Number: 5,014,111

[45] Date of Patent: May 7, 1991

[54] ELECTRICAL CONTACT BUMP AND A PACKAGE PROVIDED WITH THE SAME

[75] Inventors: Toshio Tsuda, Habikino; Yasuhiko Horio, Osaka; Yoshihiro Bessho, Kadoma; Toru Ishida, Hirakata, all of Japan

[73] Assignee: Matsushita Electric Industrial Co., Ltd., Osaka, Japan

[21] Appl. No.: 279,101

[22] Filed: Dec. 2, 1988

[30] Foreign Application Priority Data

Dec. 8, 1987 [JP] Japan .................. 62-309805
Jul. 25, 1988 [JP] Japan .................. 63-184936

[51] Int. Cl.⁵ .................. H01L 23/48; H01L 29/44; H01L 29/52; H01L 29/60
[52] U.S. Cl. .................. 357/68; 357/71; 357/75; 357/65; 437/183; 228/179; 228/180.2
[58] Field of Search .................. 357/68, 71, 75, 66, 357/65; 437/183; 228/179, 180.2

[56] References Cited

U.S. PATENT DOCUMENTS

| | | | |
|---|---|---|---|
| 2,945,286 | 7/1960 | Dorendorf | 437/183 |
| 3,373,481 | 3/1968 | Lins et al. | 29/471.3 |
| 3,878,008 | 4/1975 | Gleason et al. | 437/183 |
| 4,067,104 | 1/1978 | Tracy | 29/626 |
| 4,427,715 | 1/1984 | Harris | 427/96 |
| 4,661,192 | 4/1987 | McShane | 156/292 |
| 4,717,066 | 1/1988 | Goldenburg et al. | 228/179 |
| 4,807,021 | 2/1989 | Okumura | 357/75 |

FOREIGN PATENT DOCUMENTS

| | | | |
|---|---|---|---|
| 49-52973 | 5/1974 | Japan . | |
| 0052242 | 4/1980 | Japan | 437/183 |
| 57-4130 | 1/1982 | Japan . | |
| 57-41807 | 3/1982 | Japan . | |
| 0215057 | 12/1983 | Japan | 437/183 |
| 0005637 | 1/1984 | Japan | 437/183 |
| 59-88861 | 5/1984 | Japan . | |
| 61-287136 | 12/1986 | Japan . | |
| 0150931 | 6/1988 | Japan | 437/183 |
| 0220549 | 9/1988 | Japan | 437/183 |

*Primary Examiner*—Rolf Hille
*Assistant Examiner*—David Ostrowski
*Attorney, Agent, or Firm*—Wenderoth, Lind & Ponack

[57] ABSTRACT

A substrate provided with conductive terminals and another substrate provided with electrode pads and two-stepped electrical contact bumps formed respectively on the electrode pads and each consisting of a first raised portion and a second raised portion formed on the first raised portion, are joined securely by bonding the second raised portions coated respectively with droplets of conductive adhesive and the corresponding conductive terminals by the droplets of the conductive adhesive. The ratio of the area of a section of the first raised portion in a plane parallel to the surface of the electrode pad is greater than the area of a section of the second raised portion parallel to the section of the first raised portion at a predetermined ratio. In an exemplary method of forming the electrical contact bump, the second raised portion is formed by bending a conductive wire in a loop by a ball bonding apparatus.

24 Claims, 4 Drawing Sheets

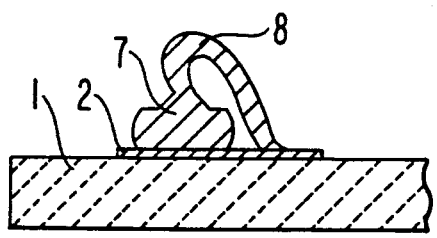
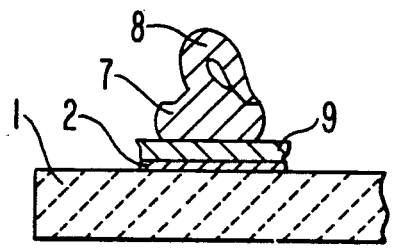 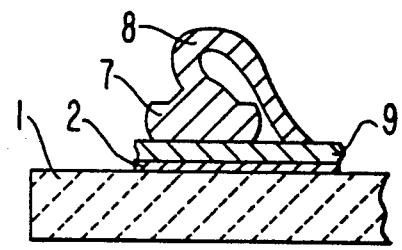
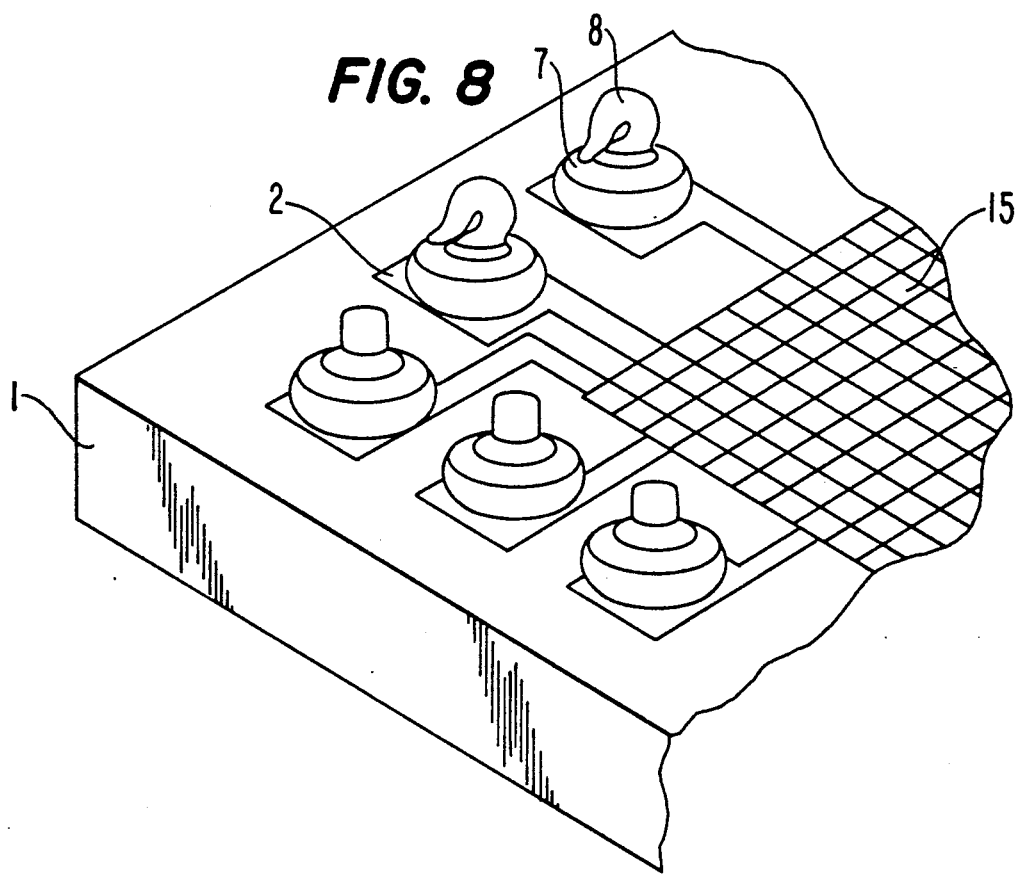

ELECTRICAL CONTACT BUMP AND A PACKAGE PROVIDED WITH THE SAME

BACKGROUND OF THE INVENTION

1. Field of the Invention

The present invention relates to an electrical contact bump for electrically connecting an electronic microcircuit chip, such as a semiconductor IC chip, to terminal electrodes on a chip support frame, a package provided with such electrical contact bumps, and a method of forming such electrical contact bumps.

2. Description of the Prior Art

Soldering has often been used to connect the contacts of an electronic microcircuit chip to conductive terminals on a chip support frame. However, reduction of intervals between the connecting terminals of an electronic microcircuit resulting from recent miniaturization and an increase in the number of the connecting terminals of electronic microcircuits, such as flat package ICs, has made the use of conventional soldering techniques for such purpose difficult. Furthermore, there is a tendency to attach bare IC chips directly to electrodes formed on a glass substrate for the efficient use of a packaging space in electronic desk calculators, electronic watches or liquid crystal displays, which strongly desires effective, precise electrical connecting techniques as a substitute for soldering.

U.S. Pat. No. 4,661,192 discloses a process for electrically bonding a bare IC chip to electrodes on a chip support frame, in which contact bumps are formed on the bonding pads of the IC chip, and the contact bumps are bonded to conductive terminals on a chip support frame by a conductive adhesive to mount the IC chip directly on the chip support frame.

A process for forming such contact bumps on the input and output electrode pads of an IC chip employs a known plating technique. Another process for the same purpose disclosed in U.S. Pat. No. 4,661,192 is a ball bonding process, in which a metallic contact ball is fixed to an electrode pad of an IC chip by a wire bonder, and then the metallic wire is cut off at the neck of the contact ball. A further process disclosed in U.S. Pat. No. 4,442,967 is a ball bonding process, in which a metallic contact ball is fixed to an electrode pad by a wire bonder, the capillary is then moved laterally from the center of the metallic contact ball over a distance 1.5 to two times the diameter of the metallic wire, and then the capillary is lowered to cut off the metallic wire by the lower end of the capillary.

These known ball bonding processes for forming contact bumps are unable to form contact bumps which a height necessary for transferring a conductive adhesive to the IC chip, which is necessary for directly mounting an IC chip on a chip support frame, and in a satisfactorily uniform shape. Furthermore, since the top of the raised contact is flat, the conductive adhesive is spread around the raised contact in mounting the IC chip on the chip support frame which may short-circuit the adjacent terminals, and hence these known ball bonding processes are not applicable to forming of contact bumps at very small intervals. On the other hand, the raised contact forming process employing plating techniques is complex and requires many processing steps and advanced etching and plating techniques. Moreover, the height of the raised contact is limited by the plating accuracy and cost.

SUMMARY OF THE INVENTION

Accordingly, it is an object of the present invention to provide a package comprising a chip support frame provided with minute conductive terminals, and an electronic microcircuit provided with input and output terminals corresponding respectively to the minute conductive terminals of the chip support frame, in which the chip support frame and the electronic microcircuit are connected electrically with a high reliability.

It is another object of the present invention to provide an optimum electrical contact bump having a sufficient height and a shape suitable for high-density packaging for the foregoing package.

It is a further object of the present invention to provide a method of forming uniform electrical contact bumps through very simple processes.

An electrical contact bump in accordance with the present invention has a two-stepped construction consisting of a first raised portion formed on an electrode pad, and a second raised portion formed on the first raised portion and having a sectional area smaller than that of the first raised portion. The two-stepped electrical contact bumps are formed on the input and output terminal pads of an electronic microcircuit chip, and the two-stepped electrical contact bumps are bonded respectively to conductive terminals on a chip support frame with a conductive adhesive. The conductive adhesive is formed in a film on a top surface of the first raised portion so as to cover the second raised portion; that is, the conductive adhesive is not spread substantially around the side surface of the first raised portion.

The electrical contact bumps thus formed in the two-stepped construction have a sufficiently large height, which facilitates transferring the conductive adhesive to the electronic microcircuit chip. In connecting the electronic microcircuit chip to the chip support frame with the conductive adhesive, the upper ends of the raised electrical contact bumps are brought into contact respectively with the conductive terminals of the chip support frame and the spread of the conductive adhesive is controlled by the stepped construction of the first raised portions and the second raised portions.

Preferably, the ratio of the area of a cross section, taken in a plane parallel to the terminal pad surface, of the second raised portion of the electrical contact bump to that of the first raised portion of the same is in the range of 3:2 to 5:1, and the ratio of height of the second raised portion to the first raised portion is in the range of 1:2 to 2:1. Such conditions provide high mechanical strength and stability of the electrical contact bumps and provide a step capable of stably securing the conductive adhesive in an amount necessary for connecting the electronic microcircuit chip to the chip support frame. Advantageously, an excellent bonding effect is achieved when the width of the electrical contact bump is in the range of 60 to 120 $\mu$m and the height of the electrical contact bump, namely, the sum of the height of the first raised portion and that of the second raised portion, is in the range of 30 to 90 $\mu$m.

It is more preferable to use a flexible conductive adhesive. The use of a flexible conductive adhesive, in combination with the shape of the electrical contact bump capable of holding a necessary amount of the conductive adhesive, enables the electrical contact bumps to be bonded to the conductive terminals on the chip support frame to be bonded very securely against mechanical stress. Thus, the present invention provides a package of a minute, highly reliable connection construction and a high practical value.

The electrical contact bumps employed in the package in accordance with the present invention can be formed by a ball bonding apparatus. A conductive ball is fixed to a terminal pad on a substrate provided with an electrode pattern with a capillary to form the first raised portion and then the conductive wire extending from the first raised portion is bent in a loop to form the second raised portion having the shape of a loop. Thus, the two-stepped electrical contact bumps meeting the foregoing conditions can easily and stably be formed. Since the second raised portion projects continuously from the first raised portion in the shape of a loop, the second raised portion has a stable strength and is formed in a shape so that the ratio of the sectional area of the second raised portion to the first raised portion is appropriate to form a film of the conductive adhesive.

The aforesaid method of forming the electrical contact bumps forms the first raised portion and the second raised portion integrally through the continuous operation of the ball bonding apparatus. Thus, the method is capable of forming electrical contact bumps having a sufficiently large height and uniform shape through a simple process, which, practically, is very advantageous.

BRIEF DESCRIPTION OF THE DRAWINGS

FIGS. 6, 7($a$) and 7($b$) are sectional views of electrical contact bumps of preferred embodiments according to the present invention formed by other methods of forming an electrical contact bump embodying the present invention; and FIG. 8 is a perspective view of a plurality of electrical contact bumps formed on the substrate of a semiconductor chip by a method of forming an electrical contact bump of a preferred embodiment according to the present invention.

DESCRIPTION OF THE PREFERRED EMBODIMENTS

An electrical contact bump in a first embodiment according to the present invention will be described with reference to FIG. 1.

Figure 1:
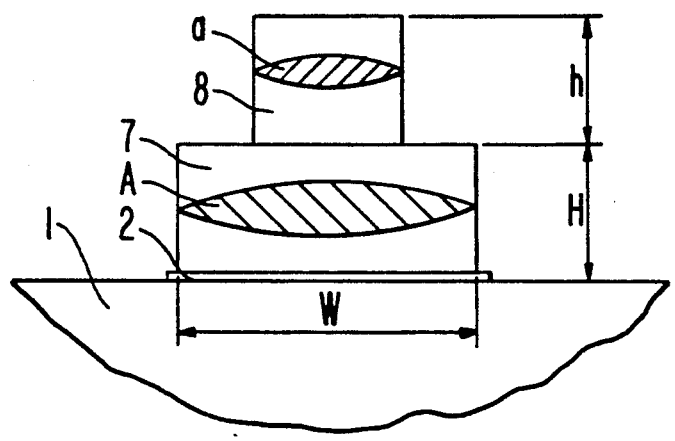
FIG. 1 is a side elevation of an electrical contact bump of a first embodiment according to the present invention.

Referring to FIG. 1, an electrical contact bump has a first raised portion 7 and a second raised portion 8. The first raised portion 7 is formed, for example, on the electrode pad 2 on a substrate 1 of a semiconductor IC chip. The size of the area of the first raised portion 7 in contact with the electrode pad 2 is the same as or smaller than that of the electrode pad 2. The width W of the first raised portion 7 is in the range of 60 to 120 $\mu$m.

The first raised portion 7 is substantially a trapezoid or rectangle in elevation in a plane perpendicular to the electrode pad 2, and may be of any suitable shape, such as a circle or a square, in its top plan view.

The second raised portion 8 of the electrical contact bump is formed on the first raised portion 7. The sectional area a of the second raised portion 8 in a plane parallel to the upper surface of the electrode pad 2 is smaller than the sectional area A of the first raised portion 7 in a plane parallel to the upper surface of the electrode pad 2. The ratio A/a is in the range of 3/2 to 5/1. The shape and position of the second raised portion 8 on the first raised portion 7 are optional provided that the second raised portion 8 is in contact with and projecting upward from the first raised portion 7. The ratio of the height H of the first raised portion 7 to the height h of the second raised portion 8, i.e., H/h, is in the range of $\frac{1}{2}$ to 2/1. The first raised portion 7 and the second raised portion 8 may be formed of gold, copper, aluminum, or an alloy containing one of those metals as a main component.

An electrical contact bump of a second embodiment according to the present invention will be described hereinafter with reference to FIG. 2.

Figure 2:
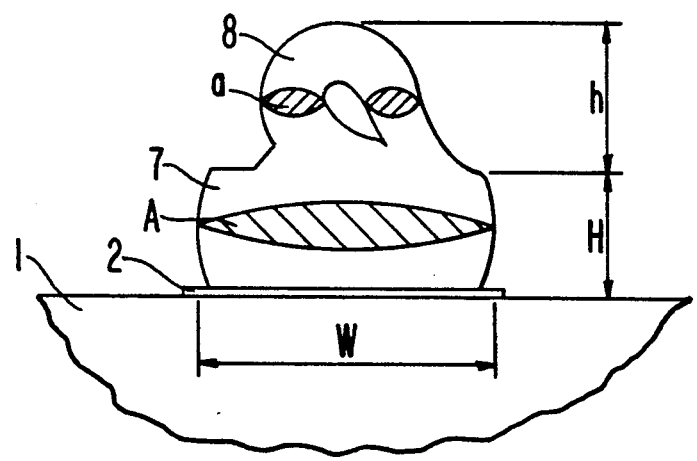
FIG. 2 is a sectional view of an electrical contact bump of a second embodiment according to the present invention.

Referring to FIG. 2, an electrical contact bump has a first raised portion 7 and a second raised portion 8. The first raised portion 7 is formed, for example, on an electrode pad on the substrate 1 of a semiconductor IC chip. The size of the area of the first raised portion 7 in contact with the electrode pad 2 is the same as or smaller than the size of the electrode pad 2. The width W of the first raised portion 7 is in the range of 60 to 120 $\mu$m. The first raised portion 7 is substantially a trapezoid or rectangle in its side elevation in a plane perpendicular to the electrode pad 2, and may be of any shape in its top plan view.

The second raised portion 8 of the electrical contact bump is a loop of a conductive wire projecting from the upper end of the first raised portion 7. The sectional area a of the second raised portion 8 in a plane parallel to the upper surface of the electrode pad 2 is smaller than the sectional area A of the first raised portion 7 in a plane parallel to the upper surface of the electrode pad 2, and the ratio A/a is in the range of 3/2 to 5/1. The shape and position of the second raised portion 8 on the first raised portion 7 are optional provided that the second raised portion 8 is in contact with and projecting upward from the upper end of the first raised portion 7. The ratio of the height H of the first raised portion 7 and the height h of the second raised portion 8, i.e., H/h, is in the range of $\frac{1}{2}$ to 2/1. The first raised portion 7 and the second raised portion 8 may be formed of gold, copper, aluminum, or an alloy containing one of those metals as a main component.

Because it is formed by bending a conductive wire in a loop, the second raised portion 8 of the electrical contact bump has a stable mechanical strength.

A package of a preferred embodiment according to the present invention employing the electrical contact bump of FIG. 2 will be described hereinafter with reference to FIGS. 3 and 4.

Figure 3:
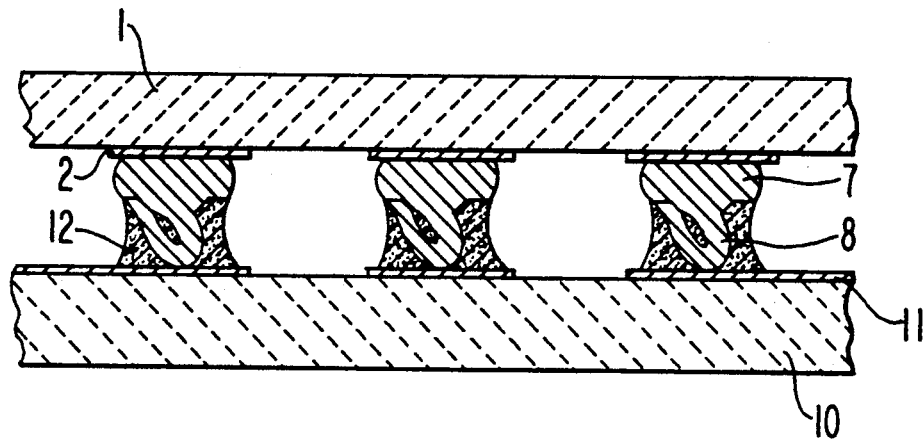
FIG. 3 is a sectional view of a package of a preferred embodiment according to the present invention.
Figure 4:
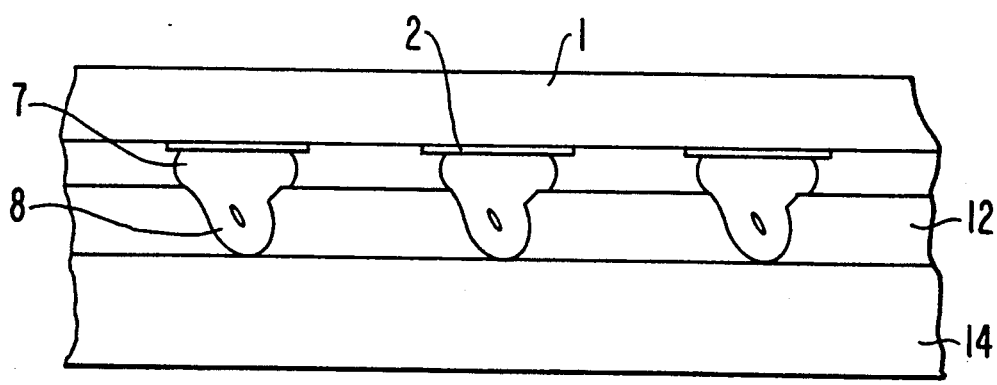
FIG. 4 is a sectional view for explaining a manner of transferring a conductive adhesive to a substrate of a package in a preferred embodiment according to the present invention.

Referring to FIG. 3, a chip support frame 10 having conductive terminals 11, and a substrate 1 forming, for example, a semiconductor IC chip having electrode pads 2 are disposed with the electrode pads 2 opposite to the corresponding conductive terminals 11, respectively.

The second raised portions 8 are enclosed respectively in droplets of a flexible conductive adhesive 12. In forming the droplets of the conductive adhesive 12, the conductive adhesive is applied over the surface of a flat plate 14 in a film having a uniform thickness in the range of 10 to 40 μm as shown in FIG. 4. Then, the semiconductor IC chip is placed on the plate 14 with the surface of the substrate 1 thereof having the electrical contact bumps facing the film of the conductive adhesive 12 so that the second raised portions 8 and the end surfaces of the first raised portions 7 where the second raised portions 7 are joined to the first raised portions 7 are buried in the film of the conductive adhesive 12. Then the substrate 1 of the semiconductor IC chip is raised in a direction perpendicular to the surface of the plate 14 coated with the conductive adhesive 12. Thus, the conductive adhesive 12 can be applied simultaneously only to each of the second raised portions 8 of the electrical contact bumps formed on the substrate 1 of the semiconductor IC chip to coat each of the second raised portions 8 perfectly and individually with the conductive adhesive 12. Since the second raised portions 7 are coated with the conductive adhesive 12 in such manner, the conductive adhesive will not spread below the first raised portions 7 near to the electrode pads 2, and hence there is no possibility that the adjacent electrode pads 2 are short-circuited by the conductive adhesive 12, which enhances the reliability of the connections. Although it was specified in the foregoing description of the process of coating the second raised portions 8 with the conductive adhesive 12 that the thickness of the film of the conductive adhesive 12 is in the range of 10 to 40 μm, the thickness of the film of the conductive adhesive 12 is dependent on the height of the electrical contact bumps formed on the electrode pads 2 of the substrate 1 of the semiconductor IC chip, and the foregoing specification is only an example and not restrictive.

The substrate 1 is placed on the chip support frame 10 with the droplets of the conductive adhesive 12 in coincidence and in contact respectively with the corresponding conductive terminals 11 on the chip support frame 10.

In the package employing such two-stepped electrical contact bumps, the thickness of the film of the conductive adhesive 12 and the spread of the same are controlled by the electrical contact bumps, and hence the electrical contact bumps can be provided in a high density. The use of the flexible conductive adhesive 12 makes the package highly resistant to stress and enhances the reliability of the package.

A method of forming the electrical contact bumps of FIG. 2 will be described hereinafter with reference to FIGS. 5(a) to 5(g), 6, 7(a) and 7(b). This method employs a ball bonding apparatus, which is used generally in this technical field, to form the electrical contact bump. In this example, the ball bonding apparatus is Model 1419 of Kulicke and Soffa. However, the ball bonding apparatus is not limited thereto; any suitable ball bonding apparatus may be employed. In this example, the electrode pad 2 formed on the surface of the substrate 1 of the semiconductor IC chip is an aluminum pad of 1 μm in thickness and 100 μm in width. The semiconductor IC chip is a standard MOS IC chip, and the dimensions of the substrate 1 are 236 mills×236 mills×20 mils.

Figure 5A:
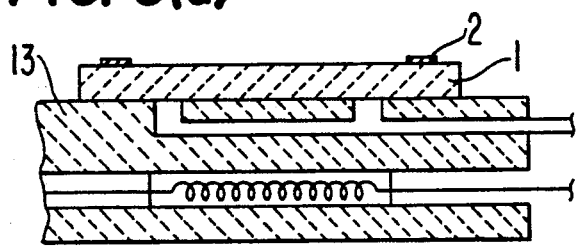
FIGS. 5($a$), 5($b$), 5($c$), 5($d$), 5($e$), 5($f$) and 5($g$) are sectional views showing different stages of a method of forming an electrical contact bump of a preferred embodiment according to the present invention.

Referring first to FIG. 5(a), the substrate 1 is positioned on a heat block 13 heated at 180° C. and is held fixedly in place by vacuum to preheat the substrate 1. In this example, the temperature of the heat block is 180° C. for bonding using heat in combination with ultrasonic vibrations. However, such temperature is not limitative and any temperature suitable for the bonding process is possible.

Figure 5B:
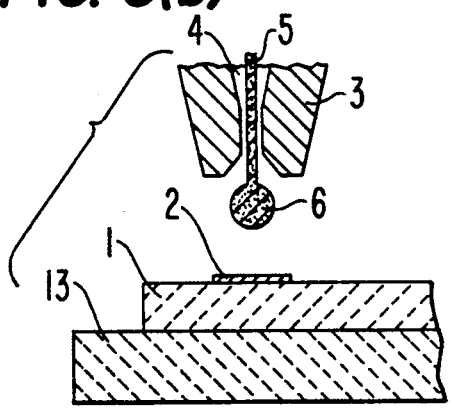

Then, as shown in FIG. 5(b), a gold wire 5 of 1 mil in diameter is inserted in the bore 4 of a standard capillary 3, which is held right above the electrode pad 2 at a height from the electrode pad 2 so that it will not touch the electrode pad 2. A ball 6 having a diameter approximately two to three times the diameter of the gold wire 5 is formed at the free end of the gold wire 5 by the thermal energy generated by electric discharge. Although the gold wire 5 employed in this example is a standard gold wire of 99.99% in purity for ball bonding, the gold wire 5 is not limited thereto. More preferably, the wire has heat-resistant characteristics such that coarse grained crystals are formed by recrystallization in a narrow area of the wire in a portion contiguous with the ball 6 when the wire is melted by thermal energy.

Figure 5C:
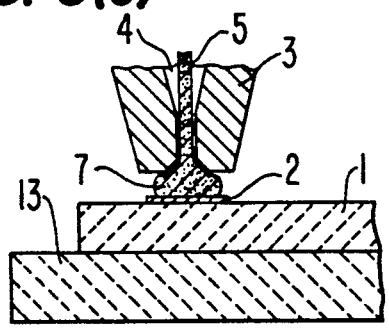

Then, as shown in FIG. 5(c), the capillary 3 is lowered toward the electrode pad 2 so as to bring the ball 6 formed at the free end of the gold wire 5 into fixed contact with the electrode pad 2 to form a first raised portion 7. The first raised portion 7 of an electrical contact bump thus formed was 85 μm in diameter and 30 μm in height. This bonding process is known as a thermosonic bonding process, which is employed generally in this technical field, in which supersonic vibration and a pressure are applied simultaneously to the wire while the substrate is heated.

Figure 5D:
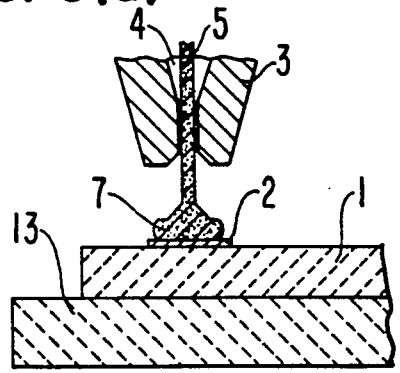

Then, as shown in FIG. 5(d), the capillary 3 is raised perpendicularly to the surface of the substrate 1 of the semiconductor IC chip by 5 mils relative to the gold wire 5 extending from the first portion 7 of the electrical contact bump. Although the height of the tip of the capillary 3 is 5 mils in this example, the process can be carried out without trouble when the height is not less than 3 mils.

Figure 5E:
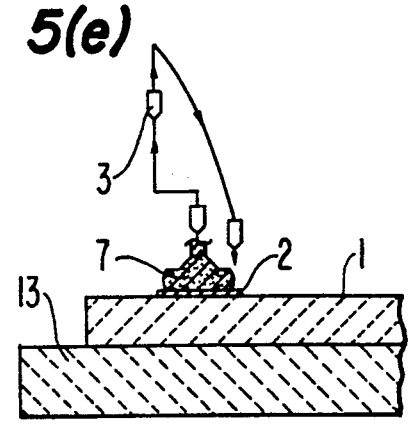

Then, as shown in FIG. 5(e), the capillary 3 is moved continuously from the raised position in parallel to the surface of the substrate 1 over 1 to 2 mils, which is referred to as a reverse motion.

After the reverse motion, the capillary 3 is raised vertically again by 100 mils. The distance of this vertical movement of the capillary 3 is dependent on the shape of a second raised portion 8 and there is no practical problem when the distance is in the range of 10 to 200 mils. Then, the capillary 3 is lowered diagonally and oppositely to the direction of the reverse motion within a circular area of 4 to 6 mils in radius above the first raised portion 7 to press the gold wire 5 with the lower end of the capillary 3 onto the first raised portion 7 at a position near the circumference of the same in a step shown in FIG. 5(f). Accordingly, it is desirable that the radius of the circle be slightly smaller than the sum of the radius of the first raised portion of the electrical contact bump and the radius of the extremity of the capillary 3 in order to form the second raised portion 8 securely. There is no particular restriction on the path and distance of the sliding movement of the capillary 3 relative to the gold wire 5 passed through the bore 4 thereof, except that the capillary moves so as to form a loop of the gold wire 5 and that the capillary 3 does not move in the same path again within a plane perpendicular to the surface of the substrate 1 of the semiconductor IC chip.

Figure 5F:
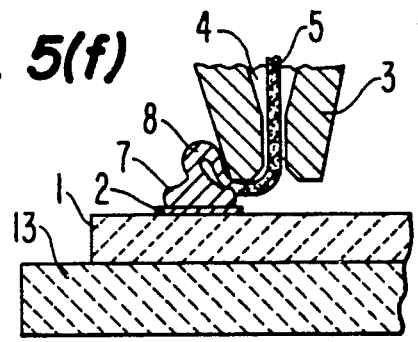

Then, as shown in FIG. 5(f), the gold wire 5 is pressed against the periphery of the first raised portion 7 with the lower end of the capillary 3 to bond the gold wire 5 to the first raised portion 7 by the same thermosonic bonding process.

Figure 5G:
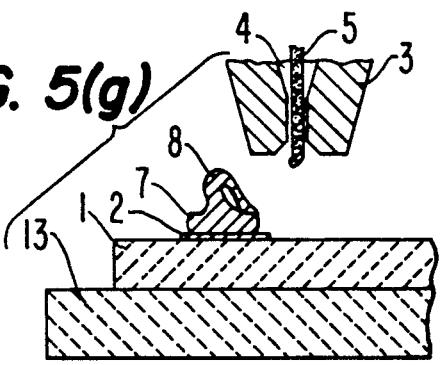

Then, as shown in FIG. 5(g), the gold wire 5 is pulled up together with the capillary 3 to sever the gold wire 5 from the loop at the junction of the loop and the gold wire 5. Consequently, a second raised portion 8 is formed on the first raised portion 7.

Although the free end of the loop of the gold wire 5 is bonded to the periphery of the first raised portion 7 in this example, the free end of the loop of the gold wire 5 may be bonded to the first raised portion 7 at a position other than a position on the periphery of the first raised portion 7. For example, as shown in FIG. 6, the free end of the loop may be bonded to the electrode pad 2 on which the first raised portion 7 is formed by further lowering the capillary 3. It is also possible to form the same electrical contact bumps as those shown in FIGS. 5(g) and 6 through the same ball bonding process on gold bumps 9 formed as base pads by plating as shown in FIGS. 7(a) and 7(b).

The two-stepped electrical contact bumps thus formed were 85 μm in diameter and 80 μm in height, namely, the sum H+h of the height H of the first raised portion 7 and the height h of the second raised portion 8. The height varied between the electrical contact bumps in the range of 1 to 5 μm. When necessary, the variation in height can further be reduced and the flatness of a plane including the tops of the electrical contact bumps can further be improved, for example, by pressing a flat and smooth surface of a plate against the electrical contact bumps in parallel to the surface of the substrate 1 of the semiconductor IC chip to reduce the range of variation in height to 0 to 1 μm. Furthermore, the two-stepped electrical contact bumps can be formed in a desired diameter and a desired height by properly regulating the diameter of the ball 6 formed at the free end of the gold wire 5 and using a gold wire having an appropriate diameter according to the shape and purpose of the two-stepped electrical contact bumps. A metallic wire suitable for ball bonding, such as a copper wire or an aluminum wire, may be used instead of the gold wire.

FIG. 8 is a perspective view showing a plurality of electrical contact bumps each consisting of a first raised portion 7 and a second raised portion 8, formed on the substrate 1 of a semiconductor IC chip by an electrical contact bump forming method in a preferred embodiment according to the present invention. A semiconductor circuit pattern 15 and a plurality of electrode pads 2 are formed on the substrate 1 of a semiconductor IC chip, and the plurality of electrical contact bumps are formed respectively on the electrode pads 2.

What is claimed is:

1. An electrical contact bump formed on an electrode pad formed on a substrate, comprising:
    a first raised portion made of an electrically conductive material and attached to the electrode pad; and
    a second raised portion formed on the first raised portion and having a cross sectional area in a plane parallel to the surface of the electrode pad smaller than that of the first raised portion in a plane parallel to the surface of the electrode pad, said second raised portion being made of the same electrically conductive material as that of said first raised portion, and the ratio of a height of said first raised portion to that of said second raised portion being in a range of $\frac{1}{2}$ to 2/1.

2. An electrical contact bump according to claim 1, wherein the ratio of the sectional area of the first raised portion to that of the second raised portion is in the range of 3/2 to 5/1.

3. An electrical contact bump according to claim 1, wherein the width of the first raised portion is in the range of 60 to 120 μm.

4. An electrical contact bump according to claim 1, wherein the the sum of the height of the first raised portion and that of the second raised portion is in the range of 30 to 90 μm.

5. An electrical contact bump according to claim 1, wherein the first and second raised portion as are formed of gold, copper, aluminum or an alloy containing gold, copper or aluminum as a main component.

6. An electrical contact bump formed on an electrode pad formed on a substrate, comprising:
    a first raised portion attached to the electrode pad; and
    a second raised portion formed on the first raised portion and having a cross sectional area in a plane parallel to the surface of the electrode pad smaller than that of the first raised portion in a plane parallel to the surface of the electrode pad, said second raised portion being made of a conductive wire extended at one end thereof from the first raised portion, bent in a loop and bonded at the other end thereof to the first raised portion.

7. An electrical contact bump according to claim 6, wherein the first and second raised portions are formed of gold, copper, aluminum or an alloy containing gold, copper or aluminum as a main component.

8. A package comprising:
    a first substrate provided with a plurality of conductive terminals;
    a second substrate provided with a plurality of electrode pads respectively at positions corresponding to the conductive terminals of the first substrate;
    a plurality of electric contact bumps formed respectively on the plurality of electrode pads, and each consisting of a first raised portion made of an electrically conductive material and attached to the corresponding electrode pad, and a second raised portion formed on the first raised portion and being made of the same electrically conductive material as that of said first raised portion, the area of a section of the second raised portion in a plane parallel to the surface of the electrode pad being smaller than the area of a section of the first raised portion parallel to the section of the second raised portion, and the ratio of a height of said first raised portion to that of said second raised portion being in a range of $\frac{1}{2}$ to 2/1; and
    droplets of a conductive adhesive respectively bonding the electrical contact bumps and the corresponding conductive terminals of the first substrate.

9. A package according to claim 8, wherein each droplet of the conductive adhesive contacts the first raised portion at substantially only a surface of the first raised portion on which the second raised portion is formed.

10. A package according to claim 8, wherein the conductive adhesive is flexible.

11. A package according to claim 8, wherein the ratio of the area of a section of the first raised portion parallel to the surface of the electrode pad to that of a section of the second raised portion parallel to the section of the first raised portion is in the range of 3/2 to 5/1.

12. The package according to claim 8 wherein the width of the first raised portion is in the range of 60 to 120 μm.

13. The package according to claim 8, wherein the sum of the height of the first raised portion and that of the second raised portion is in the range of 30 to 90 μ.

14. The package according to claim 8, wherein the electrical contact bumps are formed of gold, copper, aluminum or an alloy containing gold, copper or aluminum as a main component.

15. A package comprising:
a first substrate provided with a plurality of conductive terminals;
a second substrate provided with a plurality of electrode pads respectively at positions corresponding to the conductive terminals of the first substrate;
a plurality of electrical contact bumps formed respectively on the plurality of electrode pads, and each consisting of a first raised portion attached to the corresponding electrode pad, and a second raised portion formed on the first raised portion and having a cross sectional area in a plane parallel to the surface of the electrode pad smaller than that of the first raised portion in a plane parallel to the surface of the electrode pad, said second raised portion being made of a conductive wire extended at one end thereof from the first raised portion, bent in a loop and bonded at the other end thereof to the first raised portion; and
droplets of a conductive adhesive respectively bonding the electrical contact bumps and the corresponding conductive terminals of the first substate.

16. A package according to claim 15, wherein the droplet of the conductive adhesive contacts the first raised portion at substantially only a surface of the first raised portion on which the second raised portion is formed.

17. A package according to claim 15, wherein the conductive adhesive is flexible.

18. A package according to claim 15, wherein the electrical contact bumps are formed of gold, copper, aluminum or an alloy containing gold, copper or aluminum as a main component.

19. An electrical contact bump formed on an electrode pad formed on a substrate, comprising:
a first raised portion attached to the electrode pad; and
a second raised portion formed on the first raised portion and having a cross sectional area in a plane parallel to the surface of the electrode pad smaller than that of the first raised portion in a plane parallel to the surface of the electrode pad, the ratio of a height of said first raised portion to that of said raised portion being in a range of ½ to 2/1.

20. An electrical contact bump according to claim 19, wherein the ratio of the sectional area of the first raised portion to that of the second raised portion is in the range of 3/2 to 5/1.

21. An electrical contact bump according to claim 19, wherein the width of the first raised portion is in the range of 60 to 120 μm.

22. An electrical contact bump according to claim 19, wherein the sum of the height of the first raised portion and that of the second raised portion is in the range of 30 to 90 μm.

23. An electrical bump formed on an electrode pad formed on a substrate, comprising:
a first raised portion attached to the electrode pad; and
a second raised portion formed on the first raised portion and having a cross sectional area in a plane parallel to the surface of the electrode pad smaller than that of the first raised portion in a plane parallel to the surface of the electrode pad, said second raised portion being made of a conductive wire extended at one end thereof from the first raised portion, bent in a loop and bonded at the other end thereof to the electrode pad at a position close to the first raised portion.

24. A package comprising:
a first substrate provided with a plurality of conductive terminals;
a second substrate provided with a plurality of electrode pads respectively at positions corresponding to the conductive terminals of the first substrate;
a plurality of electrical contact bumps formed respectively on the plurality of electrode pads, and each consisting of a first raised portion attached to the corresponding electrode pad, and a second raised portion formed on the first raised portion and having a cross sectional area in a plane parallel to the surface of the electrode pad smaller than that of the first raised portion in a plane parallel to the surface of the electrode pad, said second raised portion being made of a conductive wire extended at one end thereof from the first raised portion, bent in a loop and bonded at the other end thereof to the corresponding electrode pad at a position close to the first raised portion; and
droplets of a conductive adhesive respectively bonding the electrical contact bumps and the corresponding conductive terminals of the first substrate.

* * * * *